US009281806B2

(12) United States Patent
Plavec et al.

(10) Patent No.: US 9,281,806 B2
(45) Date of Patent: Mar. 8, 2016

(54) VARIABLE PULSE WIDTH SIGNAL GENERATOR

(71) Applicant: EM MICROELECTRONIC-MARIN SA, Marin (CH)

(72) Inventors: Lubomir Plavec, Necin (CZ); Yves Theoduloz, Yverdon (CH); Petr Drechsler, Jesenice (CZ)

(73) Assignee: EM MICROELECTRONIC-MARIN SA, Marin (CH)

( * ) Notice: Subject to any disclaimer, the term of this patent is extended or adjusted under 35 U.S.C. 154(b) by 0 days.

(21) Appl. No.: 14/365,499

(22) PCT Filed: Dec. 13, 2012

(86) PCT No.: PCT/EP2012/005141

§ 371 (c)(1),
(2) Date: Jun. 13, 2014

(87) PCT Pub. No.: WO2013/087203

PCT Pub. Date: Jun. 20, 2013

(65) Prior Publication Data

US 2014/0347112 A1 Nov. 27, 2014

(30) Foreign Application Priority Data

Dec. 16, 2011 (EP) .................................... 11194002

(51) Int. Cl.

| | |
|---|---|
| ***H03K 3/017*** | (2006.01) |
| ***H03K 5/13*** | (2014.01) |
| ***H03K 7/08*** | (2006.01) |
| ***H03L 5/00*** | (2006.01) |
| *H03K 5/00* | (2006.01) |

(52) U.S. Cl.

CPC ................ *H03K 3/017* (2013.01); *H03K 5/133* (2013.01); *H03K 7/08* (2013.01); *H03L 5/00* (2013.01); *H03K 2005/00032* (2013.01)

(58) Field of Classification Search

CPC ..................................................... H03K 3/017
USPC ......................................................... 327/175
See application file for complete search history.

(56) References Cited

U.S. PATENT DOCUMENTS

| | | | |
|---|---|---|---|
| 6,191,630 B1 | 2/2001 | Ozawa et al. | |
| 2010/0033261 A1 * | 2/2010 | Stevenson et al. | ............ 332/109 |

FOREIGN PATENT DOCUMENTS

| | | |
|---|---|---|
| WO | 2010/082954 A1 | 7/2010 |

OTHER PUBLICATIONS

International Search Report of PCT/EP2012/005141 dated Mar. 15, 2013.

* cited by examiner

*Primary Examiner* — Daniel Puentes
(74) *Attorney, Agent, or Firm* — Sughrue Mion, PLLC

(57) ABSTRACT

The present invention concerns a signal generator circuit powered by a supply voltage and including flip flop means including a first input to which is connected a continuous input signal whose amplitude is defined, a second input to which is connected a clock signal whose duty cycle is defined, and a third, reset input, and outputting an output signal whose duty cycle is that of the clock signal and whose amplitude is that of the input signal, characterized in that said circuit further includes regulating means arranged to compare the output signal to a set point signal representative of the desired duty cycle and to deliver a control signal connected to the third input of the flip flop means so as to activate the reset to modify the duty cycle of the output signal.

17 Claims, 2 Drawing Sheets

VARIABLE PULSE WIDTH SIGNAL GENERATOR

This is a National phase Application in the United States of International Patent Application PCT/EP2012/005141 of Dec. 13, 2012 which claims priority on European patent application No. 11194002.9 filed Dec. 16, 2011. The entire disclosure of the above patent applications are hereby incorporated by reference.

The present invention concerns a signal generator circuit powered by a supply voltage and including flip flop means including a first input to which is connected a continuous input signal whose amplitude is defined, a second input to which is connected a clock signal whose duty cycle is defined, and a third, reset input, and outputting an output signal whose duty cycle is that of the clock signal and whose amplitude is that of the input signal.

BACKGROUND OF THE INVENTION

There are known signal generators including an analogue comparator CA to which is connected a triangular signal Vi and a continuous input signal Ve whose amplitude is a reference voltage as seen in FIG. 1. During operation of comparator CA, the input signal and the triangular signal are compared to deliver an output signal. The output signal takes the form of a rectangular signal. Indeed, the output signal Vs is a continuous signal which switches when the triangular signal voltage attains the input signal voltage value. Consequently, the output signal has a regular square shape. This square signal then has a pulse width, i.e. a ratio between the high state or low state of the signal and the period. This ratio corresponds, in the case of the arrangement described, to the ratio between the reference voltage and the triangular signal amplitude.

One drawback of this arrangement is that it requires the comparator CA to be fast, since the latter has to switch at each time interval and the switching has to be fast to avoid affecting the output signal.

Further, the duty cycle $\alpha$ is adjusted by modifying the reference voltage value. The triangular signal amplitude must be linked to the reference signal voltage value. If this is not the case, an error occurs in the duty cycle and the latter is not the desired ratio.

It is also known to use a clock having a frequency N times higher than the desired output signal frequency. This ratio of N is the discrete number of steps of the duty cycle change. To achieve this, a high frequency synchronous counter and a digital comparator at the counter output are commonly used. The desired duty cycle is the comparison value of the comparator.

However, this technique is high power consuming, particularly if the frequency increases and if the resolution, i.e. the number of steps, increases.

SUMMARY OF THE INVENTION

The invention concerns a pulse width modulation signal generator which is simple, reliable and low energy consuming.

To this end, the invention concerns a signal generator circuit powered by a supply voltage and including flip flop means including a first input to which is connected a continuous input signal whose voltage level is defined, a second input to which is connected a clock signal whose frequency and duty cycle are defined, and a third reset input, and outputting an output signal whose frequency is that of the clock signal and whose amplitude is that of the input signal, characterized in that said circuit further includes regulating means arranged to compare the output signal to a set point signal representative of the desired duty cycle and to supply a control signal connected to the third input of the flip flop means so as to activate the reset to modify the duty cycle of the output signal.

A first advantage of the present invention is that it allows a simple adjustment of the duty cycle. Indeed, only the set point signal is modified, i.e. only the set point signal voltage level is increased or lowered to modify the duty cycle. It is therefore easy to deliver a continuous signal whose amplitude can be varied, unlike a triangular signal which is more difficult to generate.

A second advantage is that the generator according to the invention is low energy consuming with respect to the prior art generator since it does not use high frequency components. These high frequency components have the drawback of being high electrical energy consuming components. Further, since it is not necessary to have components that need to be switched quickly, costs are minimised.

Advantageous embodiments of this circuit form the subject of the dependent claims.

In a first advantageous embodiment, the regulating means include a delay circuit connected to the output signal of the flip flop means and configured to supply the control signal resetting the generator circuit output signal when the high state of said output signal attains the desired duty cycle.

In a second advantageous embodiment, the delay circuit has a first region including a first p-type transistor whose source is connected to the supply voltage and whose drain is connected to the drain of a first n-type transistor, the source of said first n-type transistor being connected to the drain of a second n-type transistor whose source is connected to earth, the input signal being connected across the gate of the first p-type transistor and across the gate of the first n-type transistor, said first region being connected to a second region including a second p-type transistor and a third n-type transistor, the source of the second p-type transistor being connected to the supply voltage and the drain thereof connected to the drain of the third n-type transistor whose source is connected to the earth of the circuit, the gates of the second p-type transistor and of the third n-type transistor are both connected to the point of connection of the drains of the first p-type and n-type transistors, the output of the delay circuit being the point of connection of the drains of the second p-type transistor and of the third n-type transistor, the first and second regions being connected so as to form a point of connection from which a capacitor (C1) is arranged in parallel.

In another advantageous embodiment, the regulating means further include a set point assembly comparing the output signal of the flip flop means to a set point signal representative of the desired duty cycle in order to generate an adjustment signal sent to the gate of the second n-type transistor of the delay circuit to delay or advance the resetting of the generator circuit output signal as a function of the set point signal representative of the desired duty cycle.

In another advantageous embodiment, the set point assembly includes a filtering circuit whose input is connected to the output signal of the flip flop means and used to average said output signal, and a comparator signal whose inputs are the filtering circuit output and the set point signal representative of the desired duty cycle, said comparator circuit supplying said adjustment signal whose voltage level, representative of the difference between the filtering circuit output and the set point signal, makes it possible to modify the current passing into the second n-type transistor of the delay circuit.

In another advantageous embodiment, the filtering circuit is a low-pass filter.

In another advantageous embodiment, the flip flop means is a D flip flop.

BRIEF DESCRIPTION OF THE DRAWINGS

The objects, advantages and features of the signal generator circuit according to the present invention will appear more clearly in the following detailed description of at least one embodiment of the invention, given solely by way of non-limiting example and illustrated by the annexed drawings, in which.

DETAILED DESCRIPTION OF THE INVENTION

Figure 1:
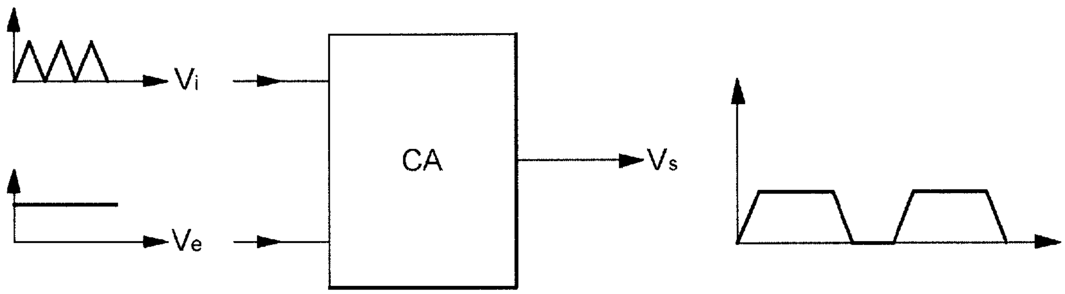
FIG. 1 is a schematic view of generator circuit according to the prior art.
Figure 2:
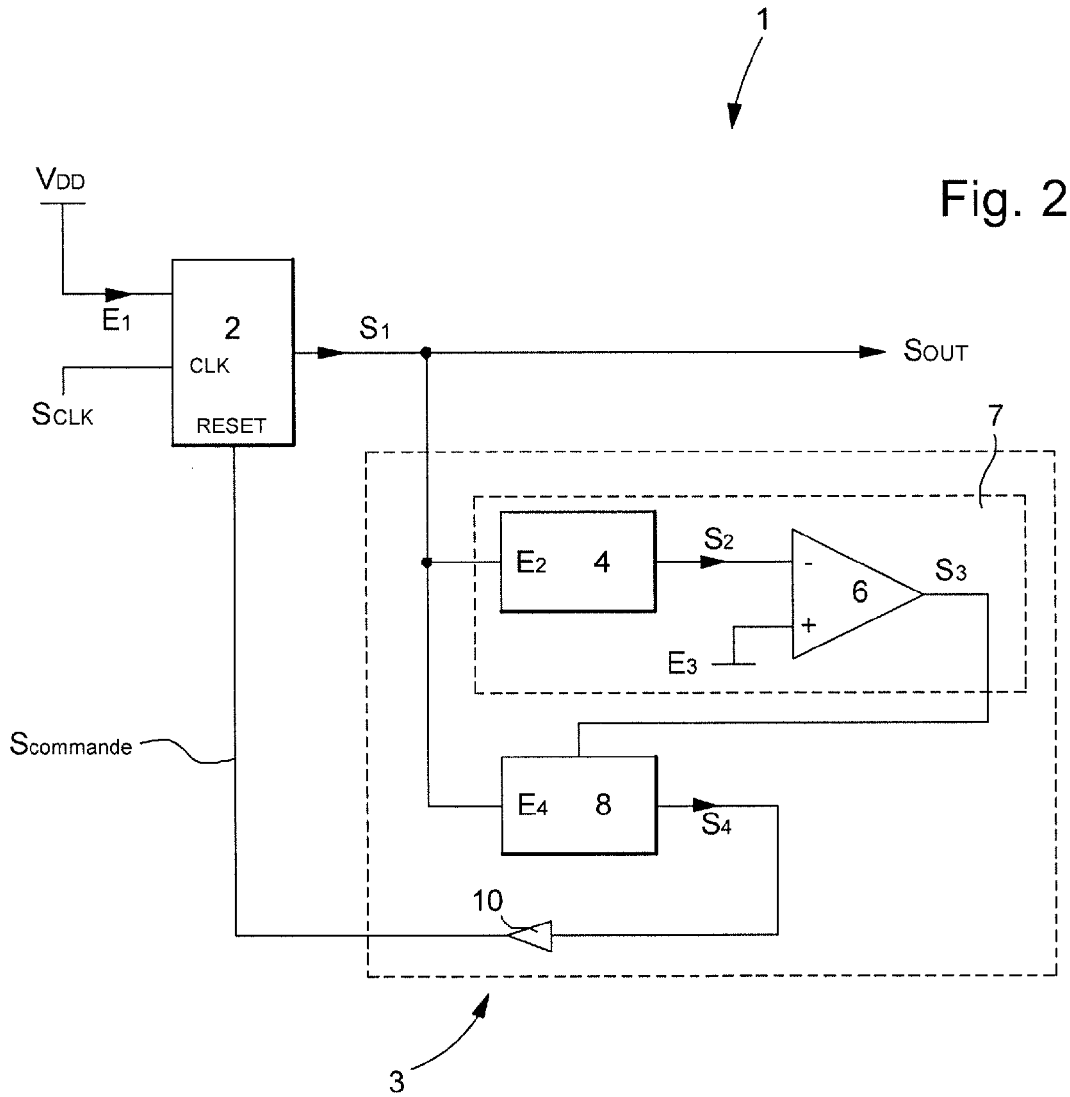
FIG. 2 is a schematic flow diagram of a generator circuit according to the invention.
Figure 3:
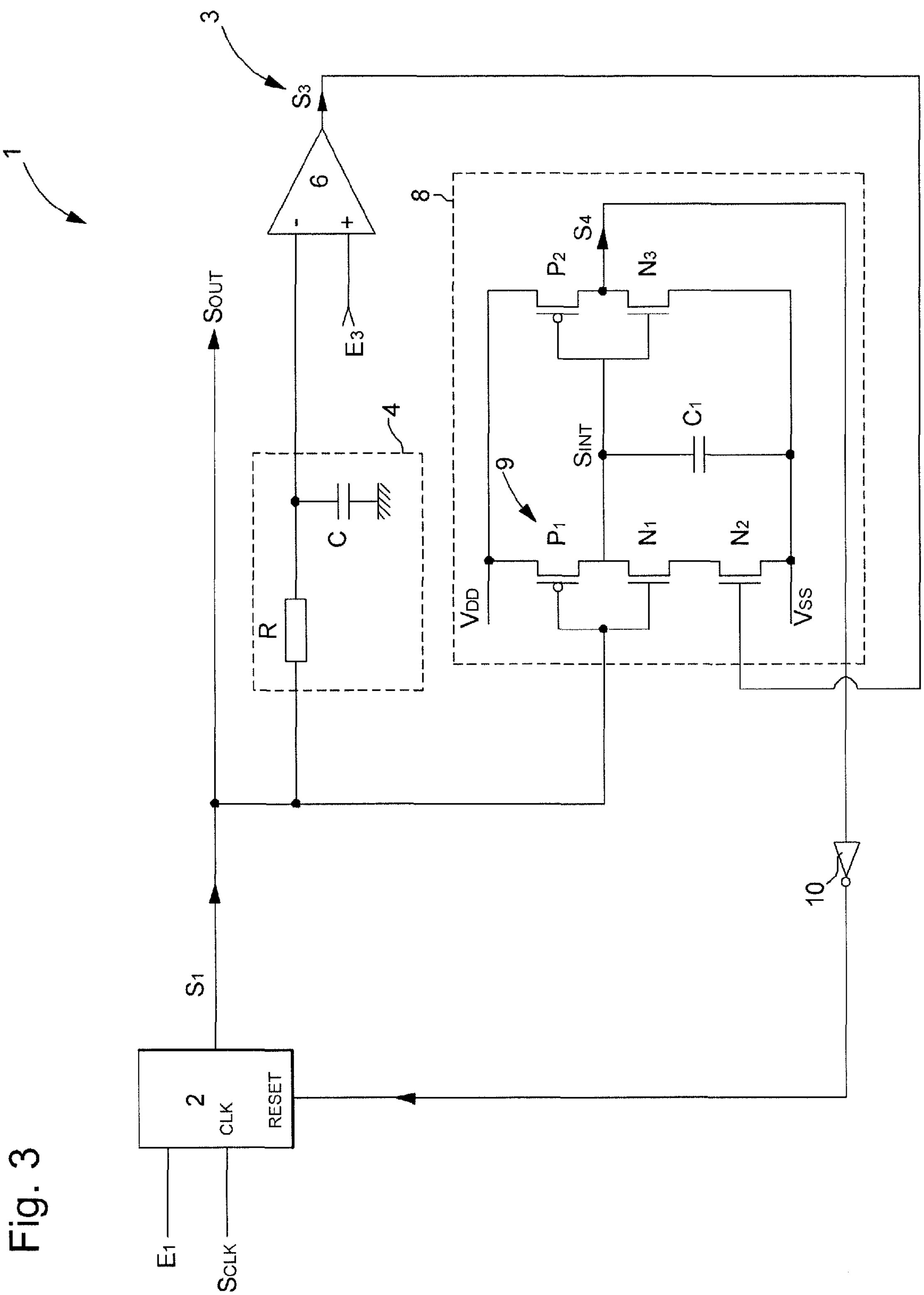
FIG. 3 is a schematic electric diagram of the generator circuit according to the invention.

FIG. 2 shows the pulse width modulation signal generator 1 according to the present invention. Generator 1 includes a flip flop means 2 including three inputs and one output. A first input CLK is connected to a clock signal Sclk. This signal is preferably a square signal. The second input is connected to a continuous input signal E1 whose voltage level is the supply voltage Vdd. This input signal is used to reset the output signal to Vdd (logic level 1) upon the leading edge of clock signal CLK, this use will be explained below. The third input is a reset input to which a reset signal RESET is connected or can be sent, this signal defines the time that the output signal S1 passes to voltage level Vdd (logic level 1) and thus defines the duty cycle α of output signal S1.

Output signal S1 of flip flop means 2 is also the final generator output signal Sout. This output is also connected to a regulating loop 3. This regulating loop 3 includes a filtering circuit 4. Output signal S1 is connected to an input E2 of filtering circuit 4, the latter is used to average signal S1. The output of filtering circuit 4 delivers a signal S2. This signal S2 is a continuous voltage whose value is the mean of output signal S1 and is connected to the negative input of an operational amplifier 6 also forming part of regulating loop 3. The positive input of said operational amplifier 6 is connected to a continuous signal Vref whose voltage level may be defined by the user. Operational amplifier 6 outputs a continuous signal S3 whose voltage level is representative of the difference between the two signals. This output of amplifier 6 is connected to a delay circuit 8 including an input E4 to which is connected output signal S1 of flip flop means 2. This delay circuit 8, integrated in regulating loop 3, is used such that output signal S4 of delay circuit 8 is a control signal passing through an inverter circuit 10 and then connected to the RESET input of flip flop means 2. This output signal S4 thus acts like a reset signal.

More specifically, flip flop means 2 is a D flip flop. This D flip flop 2 has, as a first input, a clock signal Sclk, preferably a square signal whose duty cycle α is 50% and, as a second input, a continuous input signal E1, whose voltage level is a reference voltage value. The output of D flip flop 2 delivers a square output signal S1 whose voltage level is that of input signal E1. This output signal S1 of D flip flop 2 is the final output signal Sout of generator 1.

Advantageously according to the invention, this final output signal Sout is controlled via regulating means 3 in the form of a regulating loop described in detail below.

Signal S1 is sent to a set point assembly 7, including a filtering circuit 4. This filtering circuit 4 is a low-pass filter, typically an RC circuit. An RLC or Sallen-Key low-pass filter may also be envisaged. This filtering circuit 4 is used for averaging signal S1. The result of the filtering of signal S1, which is a square signal, is a continuous signal S2. The components of this filtering circuit 4, i.e. resistor R and capacitor C are sized such that the voltage level obtained is proportional to the duty cycle. For example, for a signal S1 with a duty cycle of 50% and voltage level Vdd, a continuous signal S2 with a voltage level of Vdd/2 would be obtained. Similarly, for a signal S1 with a duty cycle of 25% and voltage level Vdd, a continuous signal S2 with a voltage level of Vdd/4 would be obtained.

This signal S2 is then connected to the negative input of operational amplifier 6 also forming part of set point assembly 7. A signal E3 is connected to the positive input of this operational amplifier 6. This signal E3 is a continuous signal with a voltage level Vref. Signal S2 and signal E3 are compared to each other to supply at the output of said operational amplifier 6 a signal S3 called the set point signal. This set point signal S3 is connected to one of the inputs of delay circuit 8. Another input of delay circuit 8 is input signal S1 exiting flip flop means 2.

Delay circuit 8 includes two distinct regions. A first region includes three switching means 9, which are MOFSET transistors here. More specifically, these three flip flop means 9 are two n-type transistors N1 and N2 and one p-type transistor P1. These three transistors are arranged so that the source of the first p-type transistor P1 is connected to supply voltage Vdd and the drain thereof is connected to the drain of a first n-type transistor N1. The source of the first n-type transistor N1 is connected to the drain of a second n-type transistor N2. The source of second n-type transistor N2 is connected to earth Vss of delay circuit 8. Signal S1 is also connected to the gate of first p-type transistor P1 and to the gate of the first n-type transistor N1, the gate of the second n-type transistor N2 being connected to signal S3.

The connection point between first p-type transistor P1 and first n-type transistor N1 is used to connect this first region of the delay circuit to the second region of the delay circuit. This second region includes two flip flop means 9 taking the form of two transistors; a second p-type transistor P2 and a third n-type transistor N3. The source of second p-type transistor P2 is connected to supply voltage Vdd and the drain thereof is connected to the source of the third n-type transistor N3. The drain of the latter is connected to earth Vss of circuit 8. The gates of transistors P2 and N3 are both connected to the connection point between transistors P1 and N1.

Between these two regions, at least one uncoupling capacitor C1 is arranged in parallel so that the input of capacitor C1 is connected to the connection point between transistors P1 and N1 and to the gates of transistors P2 and N3, while the output of capacitor C1 is connected to earth Vss. Of course, it is possible to envisage having several parallel connected capacitors.

The output of delay circuit 8 is the connection point between transistors P2 and N3. The output signal of delay circuit 8 is control signal S4 which is then inverted by an inverter circuit 10. Once this set point signal S4 has been inverted, it is connected to the RESET input of D flip flop 2. This connection allows control signal S4 to act directly on signal S1 and modify it.

During operation of signal generator 1, the duty cycle of output signal S1, Sout is modified and adjusted by regulating loop 3. This regulating loop 3 includes delay circuit 8, filtering circuit 4 and operational amplifier 6.

In fact, filtering circuit 4 and operational amplifier 6 forming set point assembly 7 are used to compare the voltage level of signal S2, proportional to supply voltage Vdd and representative of the duty cycle α of signal S1, to signal E3 having voltage level Vref and to supply a signal controlling delay circuit 8. Delay circuit 8 operates as explained below.

Signal S1 is applied to input E4 of delay circuit 8, i.e. applied to the gates of transistors N1 and P1.

At the start, signal S1, which is a square signal, is at the low state or logic level 0, i.e. with a voltage level of zero volts. First n-type transistor N1 is in the OFF-state, i.e. non conducting, whereas the first p-type transistor P1 is in the ON-state. Supply voltage Vdd passes through first p-type transistor P1 and is transmitted to the second region. This signal is called intermediate signal Sint. This signal Sint, at logic state 1, is applied to the gates of transistors P2 and N3. In this case, the second p-type transistor P2 is in the OFF-state and the third n-type transistor N3 is in the ON-state. Consequently, it is earth Vss, i.e. the zero volt point or logic state 0, which is connected to the output causing control signal S4 of delay circuit 8 to change to the low state. Control signal S4 is inverted on passing through inverter 10 and changes to the high state before being sent to the RESET input of D flip flop 2. D flip flop 2 is configured so that the RESET function is active in the low state, i.e. when a low state signal is sent to the RESET input of flip flop means 2. Since inverted signal S4 is in the high state, the reset function is not activated.

When signal S1 changes to the high state, transistor P1 ceases to be in the ON-state and changes to the OFF-state whereas, conversely, transistor N1 changes from the OFF-state to the ON-state. Assuming that transistor N2 is also ON (the role of transistor N2 will be explained below), it is the potential of earth Vss, i.e. logic state 0, which is transmitted to the second region of delay circuit 8. Uncoupling capacitor C1 is used so that the change from the high state to the low state occurs gradually, i.e. with a time constant.

Provided signal Sint has not crossed the switching voltage threshold of transistors N3 and P2, transistor P2 remains OFF and transistor N3 remains ON, and control signal S4 therefore does not change. However, when the voltage level of signal Sint descends below the switching voltage threshold of transistors N3 and P2, the switching of transistors P2 and N3 occurs. Transistor P2 changes from the OFF-state to the ON-state and transistor N3 changes from the ON-state to the OFF-state. Control signal S4 thus changes from the low state to the high state. Through the action of inverter 10, the signal sent to the RESET input of flip flop means 2 is a low state signal. This low state activates the reset function of flip flop 2 so that signal S1 instantaneously switches from the high state to the low state.

The result is a fast switch of transistor P1, which is becomes ON again so that signal Sint changes to the high state again. When the voltage level of signal Sint exceeds the voltage threshold of transistors P2 and N3, the latter switch so that transistor P2 is OFF and transistor N3 is ON. Control signal S4 then changes from the low state and while being inverted changes from the high state when it enters the RESET input of D flip flop 2. This high state of the signal applied to the RESET input of D flip flop 2 causes the stopping of the reset function.

During operation of generator 1, the adjustment of duty cycle α is achieved by means of signal S3. In fact, signal S3 corresponds to the comparison of signal S2, which is the filtered signal S1, to signal E3, which is a reference signal whose voltage level is a reference voltage proportional to the supply voltage, like signal S2.

The operational amplifier is devised to output signal S3 whose voltage level is a voltage representative of the comparison between signal S2 and signal E3. The voltage level of signal S3 increases if signal S2 is higher than signal E3 but it decreases if signal S2 is lower than signal E3. Signal S3 is then sent to the gate of transistor N2 in order to adjust duty cycle α.

Indeed, the principle used is that the comparison between signal S2 and signal E3 makes it possible to supply, at the output of operational amplifier 6, a signal representative of this comparison acting on second n-type transistor N2. Signal S3 is used to act on the channel of second n-type transistor N2 so that the channel opens more or less according to the voltage level of signal S3, i.e. according to the result of the comparison between signal S2 and signal E3. If signal S2 is higher than signal E3, the voltage level of signal S3 increases and, consequently, the channel of transistor N2 opens further. This makes it possible for a larger current to pass. This greater opening of the channel is perceptible when the first n-type transistor N1 is also ON, i.e. when signal S1 changes to the high state. This additional current supply has an effect on signal Sint, since passing more current modifies the discharge from capacitor C1. More specifically, if more current passes into second n-type transistor N2, the discharge from capacitor C1 is faster. Signal Sint thus crosses the voltage threshold of transistors P2 and N3 more quickly. Since the voltage threshold is crossed more quickly, transistors P2 and N3 also switch faster and the reset function is activated faster. This faster activation has the effect of decreasing the duty cycle α of output signal Sout. This result is the desired objective, since, if signal S2 is higher than signal E3, this means that duty cycle α of signal S1 is greater than the required duty cycle.

Conversely, if the duty cycle has to be increased, signal S2 is lower than signal E3. Output signal S3 of operational amplifier 6 will have a voltage level representative of this lower comparison. The lower voltage level results in a smaller opening of the channel of transistor N2 and thus a smaller quantity of current passing through said transistor N2. The discharge from capacitor C1 is slowed down. Signal Sint thus crosses the switching voltage threshold of transistors P2 and N3 more slowly. Since the switching voltage level is crossed more slowly, transistors P2 and N3 also switch more slowly and the reset function is activated more slowly. The effect of this slower activation is to increase duty cycle α, i.e. to increase the high state of signal S1 with respect to the low state. This is the desired objective since if signal S2 is lower than signal E3, this means that duty cycle α is lower than the required duty cycle α.

The comparison of signal S2 and signal E3 is continuous so that the purpose of this regulating loop is for signal S2 and signal S3 to be identical to deliver a signal S3 setting the opening of the channel of second n-type transistor N2.

It is therefore concluded that the delay circuit 8 is used to deliver, at a precise moment, a control signal S4 activating the reset. The assembly including filtering circuit 4 and operational amplifier 6 is arranged to supply a set point signal S3 which modifies the precise moment at which delay circuit 8 sends the control signal S4 activating zero reset. The moment at which the control signal has to reset D flip flop 2 to zero makes it possible to define the duty cycle α and is adjustable according to the difference between signal S2 and signal E3.

It will be clear that various alterations and/or improvements and/or combinations evident to those skilled in the art may be made to the various embodiments of the invention set out above without departing from the scope of the invention defined by the annexed claims.

For example, the transistors of delay circuit 8 could be bipolar or JFET transistors.

What is claimed is:

1. A signal generator circuit powered by a supply voltage and including flip flop means including a first data input to which is connected a continuous input signal (E1) whose voltage level is defined, a second input to which is connected a clock signal (Sclk) whose frequency and duty cycle are defined and a third reset input, and outputting an output signal (S1, Sout) whose frequency is that of the clock signal and whose amplitude is that of the input signal, wherein said circuit (1) further includes regulating means arranged to compare the output signal to a set point signal (E3) representative of the desired duty cycle and to supply a control signal (S4) connected to the third input of the flip flop means so as to activate the reset to modify the duty cycle of the output signal (S1), and wherein the flip flop means is a D flip flop.

2. The signal generator circuit according to claim 1, wherein the regulating means include a delay circuit connected to the output signal (S1) of the flip flop means and configured to supply the control signal (S4) resetting the output signal (S1, Sout) of the generator circuit when the high state of said output signal (S1, Sout) attains the desired duty cycle.

3. The signal generator circuit according to claim 2, wherein the delay circuit has a first region including a first p-type transistor (P1) whose source is connected to the supply voltage (Vdd) and whose drain is connected to the drain of a first n-type transistor (N1), the source of said first n-type transistor being connected to the drain of a second n-type transistor (N2) whose source is connected to earth, the output signal (S1) being connected to the gate of the first p-type transistor (P1) and to the gate of the first n-type transistor, said first region being connected to a second region including a second p-type transistor and a third n-type transistor, the source of the second p-type transistor being connected to the supply voltage (Vdd) and the drain thereof connected to the drain of the third n-type transistor whose source is connected to the earth (Vss) of the circuit, the gates of the second p-type transistor and of the third n-type transistor are both connected to the point of connection of the drains of the first p-type and n-type transistors, the output of the delay circuit being the point of connection of the drains of the second p-type transistor and of the third n-type transistor, the first and second regions being connected so as to form a point of connection from which a capacitor (C1) is arranged in parallel.

4. The signal generator circuit according to claim 2, wherein the regulating means further include a set point assembly comparing the output signal (S1) of the flip flop means to a set point signal representative of the desired duty cycle (E3) in order to generate an adjustment signal (S3) sent to a gate of the second n-type transistor (N2) of the delay circuit in order to delay or advance the reset of the output signal (S1) of the generator circuit as a function of the set point signal representative of the desired duty cycle (E3).

5. The signal generator circuit according to claim 4, wherein the regulating means further include a set point assembly comparing the output signal (S1) of the flip flop means to a set point signal representative of the desired duty cycle (E3) in order to generate an adjustment signal (S3) sent to the gate of the second n-type transistor (N2) of the delay circuit in order to delay or advance the reset of the output signal (S1) of the generator circuit as a function of the set point signal representative of the desired duty cycle (E3).

6. The signal generator circuit according to claim 4, wherein the set point assembly includes a filtering circuit whose input is connected to the output signal (S1) of the flip flop means and used for averaging said output signal, and a comparator circuit whose inputs are the output of the filtering circuit and the set point signal representative of the desired duty cycle (E3), said comparator circuit supplying said adjustment signal (S3) whose voltage level, representative of the difference between the filtering circuit output and the set point signal (E3) makes it possible to modify the current passing into the second n-type transistor (N2) of the delay circuit.

7. The signal generator circuit according to claim 5, wherein the set point assembly includes a filtering circuit whose input is connected to the output signal (S1) of the flip flop means and used for averaging said output signal, and a comparator circuit whose inputs are the output of the filtering circuit and the set point signal representative of the desired duty cycle (E3), said comparator circuit supplying said adjustment signal (S3) whose voltage level, representative of the difference between the filtering circuit output and the set point signal (E3) makes it possible to modify the current passing into the second n-type transistor (N2) of the delay circuit.

8. The signal generator circuit according to claim 5, wherein the filtering circuit is a low-pass filter.

9. The signal generator circuit according to claim 6, wherein the filtering circuit is a low-pass filter.

10. A signal generator circuit powered by a supply voltage and including flip flop means including a first data input to which is connected a continuous input signal (E1) whose voltage level is defined, a second input to which is connected a clock signal (Sclk) whose frequency and duty cycle are defined and a third reset input, and outputting an output signal (S1, Sout) whose frequency is that of the clock signal and whose amplitude is that of the input signal, wherein said circuit (1) further includes regulating means arranged to compare the output signal to a set point signal (E3) representative of the desired duty cycle and to supply a control signal (S4) connected to the third input of the flip flop means so as to activate the reset to modify the duty cycle of the output signal (S1), wherein the regulating means include a delay circuit connected to the output signal (S1) of the flip flop means and configured to supply the control signal (S4) resetting the output signal (S1, Sout) of the generator circuit when the high state of said output signal (S1, Sout) attains the desired duty cycle, said delay circuit having a first region including a first p-type transistor (P1) whose source is connected to the supply voltage (Vdd) and whose drain is connected to the drain of a first n-type transistor (N1), the source of said first n-type transistor being connected to the drain of a second n-type transistor (N2) whose source is connected to earth, the output signal (S1) being connected to the gate of the first p-type transistor (P1) and to the gate of the first n-type transistor, said first region being connected to a second region including a second p-type transistor and a third n-type transistor, the source of the second p-type transistor being connected to the supply voltage (Vdd) and the drain thereof connected to the drain of the third n-type transistor whose source is connected to the earth (Vss) of the circuit, the gates of the second p-type transistor and of the third n-type transistor are both connected to the point of connection of the drains of the first p-type and n-type transistors, the output of the delay circuit being the point of connection of the drains of the second p-type transistor and of the third n-type transistor, the first and second regions being connected so as to form a point of connection from which a capacitor (C1) is arranged in parallel.

11. The signal generator circuit according to claim 10, wherein the flip flop means is a D flip flop.

12. The signal generator circuit according to claim 10, wherein the regulating means further include a set point assembly comparing the output signal (S1) of the flip flop means to a set point signal representative of the desired duty cycle (E3) in order to generate an adjustment signal (S3) sent to the gate of the second n-type transistor (N2) of the delay circuit in order to delay or advance the reset of the output signal (S1) of the generator circuit as a function of the set point signal representative of the desired duty cycle (E3).

13. The signal generator circuit according to claim 10, wherein the regulating means further include a set point assembly comparing the output signal (S1) of the flip flop means to a set point signal representative of the desired duty cycle (E3) in order to generate an adjustment signal (S3) sent to the gate of the second n-type transistor (N2) of the delay circuit in order to delay or advance the reset of the output signal (S1) of the generator circuit as a function of the set point signal representative of the desired duty cycle (E3).

14. The signal generator circuit according to claim 12, wherein the set point assembly includes a filtering circuit whose input is connected to the output signal (S1) of the flip flop means and used for averaging said output signal, and a comparator circuit whose inputs are the output of the filtering circuit and the set point signal representative of the desired duty cycle (E3), said comparator circuit supplying said adjustment signal (S3) whose voltage level, representative of the difference between the filtering circuit output and the set point signal (E3) makes it possible to modify the current passing into the second n-type transistor (N2) of the delay circuit.

15. The signal generator circuit according to claim 13, wherein the set point assembly includes a filtering circuit whose input is connected to the output signal (S1) of the flip flop means and used for averaging said output signal, and a comparator circuit whose inputs are the output of the filtering circuit and the set point signal representative of the desired duty cycle (E3), said comparator circuit supplying said adjustment signal (S3) whose voltage level, representative of the difference between the filtering circuit output and the set point signal (E3) makes it possible to modify the current passing into the second n-type transistor (N2) of the delay circuit.

16. The signal generator circuit according to claim 13, wherein the filtering circuit is a low-pass filter.

17. The signal generator circuit according to claim 14, wherein the filtering circuit is a low-pass filter.

* * * * *